United States Patent [19]

Tamba et al.

[11] Patent Number: 5,168,197
[45] Date of Patent: Dec. 1, 1992

[54] ION BEAM GENERATING APPARATUS, FILM-FORMING APPARATUS, AND METHOD FOR FORMATION OF FILM

[75] Inventors: Moritake Tamba, Chiba; Katushige Yamada; Kazuhiko Kawamura, both of Aichi, all of Japan

[73] Assignees: Rikagaku Kenkyusho, Wako; Chubu Electric Power Company, Incorporated, Nagoya; TDK Corporation, Tokyo, all of Japan

[21] Appl. No.: 858,865

[22] Filed: Mar. 27, 1992

[30] Foreign Application Priority Data

Mar. 28, 1991 [JP] Japan .................................. 3-64854
Feb. 14, 1992 [JP] Japan .................................. 4-28167

[51] Int. Cl.⁵ ...................... H01J 27/08; H01J 27/18; H05H 1/24
[52] U.S. Cl. ...................... 315/111.81; 315/111.21; 315/111.31; 315/111.41; 313/231.31; 250/423 R; 204/298.38; 204/298.41
[58] Field of Search .................. 315/111.21, 111.31, 315/111.41, 111.81; 313/231.31; 250/423 R; 204/298.38, 298.41, 192.38

[56] References Cited

U.S. PATENT DOCUMENTS

| | | | |
|---|---|---|---|
| 4,612,477 | 9/1986 | Dothan .................... | 315/111.81 X |
| 4,785,220 | 11/1988 | Brown et al. .................. | 315/111.81 |
| 4,883,968 | 11/1989 | Hipple et al. .............. | 315/111.81 X |
| 4,924,102 | 5/1990 | Toya et al. .................. | 250/423 R X |
| 5,022,977 | 6/1991 | Matsuoka et al. .......... | 315/111.81 X |

Primary Examiner—Eugene R. LaRoche
Assistant Examiner—Do Hyum Yoo
Attorney, Agent, or Firm—Oblon, Spivak, McClelland, Maier & Neustadt

[57] ABSTRACT

An ion beam generating apparatus including a vacuum chamber for retaining a vacuum therein, a microwave being introduced therein through at least one portion thereof, at least one vacuum arc plasma generating source having a cathode, an anode, and arc generating device and disposed inside the vacuum chamber, and ion extracting device for extracting ions from the plasma.

10 Claims, 5 Drawing Sheets

ION BEAM GENERATING APPARATUS, FILM-FORMING APPARATUS, AND METHOD FOR FORMATION OF FILM

BACKGROUND OF THE INVENTION

1. Field of the Invention

This invention relates to an ion beam generating apparatus, a film-forming apparatus, and a method for the formation of a film. More particularly, this invention relates to an ion beam generating apparatus suitable for production of a metal ion beam containing polyelectrolytically dissociated ions in a large proportion and having a large electric current, a film-forming apparatus and a method for the formation of a film, the both suitable for the formation of a film containing impurities only sparingly and excelling in quality.

2. Description of the Related Art

As techniques for producing a metal ion beam, methods which are depicted in FIG. 6 and FIG. 7 have been heretofore known. These methods operate with the procedure which comprises vaporizing a substance forming a cathode by virtue of vacuum arc discharge and ionizing the resultant vapor thereby forming a metal plasma and extracting a metal ion beam from the metal plasma (Japanese Unexamined Patent Publication No. 276,858/1988).

In an apparatus illustrated in FIG. 6, a cathode 2 formed of a work blank as an ion source is opposed to an anode 3 across an interposed space inside a vacuum chamber 1. The anode 3 is kept in place with a conically shaped retaining member 4 and is provided at the leading terminal thereof with an opening for release of ions. To generate an ion beam, first a feeble discharge is produced between the cathode 2 and a trigger electrode 5 disposed concentrically thereto and an arc discharge is consequently induced between the cathode 2 and the anode 3. The arc thus generated has intensity enough to vaporize part of the cathode 2 and form a plasma. The generated plasma moves in the direction of the anode 3 and passes through the opening of the anode 3. To control this movement of the plasma jet, a coil 6 disposed outside the vacuum chamber 1 forms a magnetic field. A set of ion extracting electrode 7 is disposed at a stated distance from the anode 3. By this ion extracting electrode 7, ions are extracted from the plasma which has passed the anode 3.

In an apparatus illustrated in FIG. 7, a rotatable holder 9 is disposed inside a vacuum chamber 8, a plurality of cathodes 10 are retained at equal radial positions on the holder 9, and an anode mask plate 12 for retaining an anode 11 is fixed in front of the holder 9 as opposed to the cathodes 10. Further, an ion path 13 is formed on a line parallel to the axis of rotation of the holder 9 on the radiuses including the positions of the cathodes 10 in the vacuum chamber 8. An ion extracting electrode 14 is disposed in the ion path 13. Inside the vacuum chamber 8 behind the ion path 13, a trigger electrode 15 is set in close proximity to the cathode 10.

In this apparatus, the cathodes 10 are disposed at suitable positions in the ion path 13 so as to allow formation of an arc plasma relative to the different cathodes 10.

In the conventional ion beam generating apparatuses of this class, an ion beam is directly extracted from a metal plasma which is formed by vacuum arc discharge. As a result, these apparatuses have the disadvantage that the proportion of polyelectrolytically dissociated ions in the ion beam is very small and the ion extraction system for imparting a prescribed energy to the ion beam must be given a large power supply capacity.

A film-forming apparatus constructed as illustrated in FIG. 8 to accomplish the formation of a film by the use of a metal plasma generated by vacuum arc discharge as described above has also been known. In the film-forming apparatus illustrated in FIG. 8, a cathode 17 and an anode 18 provided with an opening part are opposed to each other across an intervening space inside a vacuum chamber 16. The cathode 17 is provided on the anode 18 side thereof with a mechanically operably constructed trigger electrode 19. On the lateral side of the anode 18 is disposed a holder 21 for retaining a substrate 20 intended to allow formation of a film thereon.

In this film-forming apparatus, vacuum arc discharge is initiated by an arc power source 22 applying voltage and the trigger electrode 19 meanwhile beating the cathode 17 and the vacuum arc discharge is generated between the cathode 17 and the anode 18 and an arc plasma is consequently formed. Then, a film is formed by causing ions in the arc plasma to be deposited by means of a bias power source 23 on the substrate 20 which is set at a prescribed potential.

The conventional film-forming apparatus of this class, however, has the disadvantage that impurities originating in the trigger electrode 19 and the anode 18 mingle with the formed film and impair the quality of the film. When the apparatus uses a mechanical trigger mechanism, it entails an operational problem.

SUMMARY OF THE INVENTION

An object of this invention is to provide an ion beam generating apparatus which enables ions in an ion beam to be electrolytically dissociated to the highest possible order and allows an ion extraction system used therein to decrease the power source capacity thereof.

Another object of this invention is to provide a film-forming apparatus which is capable of forming a film excelling in quality and suffering inclusion therein of impurities only sparingly.

Still another object of this invention is to provide a method for the formation of a film, which method is capable of forming a film excelling in quality and suffering inclusion therein of impurities only sparingly.

To be specific, this invention is directed to an ion beam generating apparatus comprising a vacuum chamber for retaining a vacuum therein, at least one vacuum arc plasma generating source having a cathode, an anode, and arc generating means and installed inside the vacuum chamber, and ion extracting means for extracting ions from the plasma, wherein a microwave is introduced in the vacuum chamber through at least one portion thereof.

The introduction of a microwave mentioned above is attained by opening a waveguide into the vacuum chamber. Specifically, a cylindrical part is projected from the vacuum chamber and a cylindrical cathode is concentrically disposed inside the cylindrical part in order that the cylindrical part of the vacuum chamber and the cathode may jointly form a waveguide and this waveguide may be utilized for introducing the microwave into the vacuum chamber.

It is further permissible to dispose magnetic field forming means outside the vacuum chamber and effect application thereby of a magnetic field which is capable of preventing the generated arc plasma from diffusion and confining it inside the vacuum chamber.

The film-forming apparatus of this invention comprises a vacuum chamber for retaining a vacuum therein, a holder disposed inside the vacuum chamber and adapted to retain a substratal material for film formation, a microwave introducing mechanism for introducing a microwave into the vacuum chamber, and a vacuum arc plasma generating source, provided with a cathode formed of a film forming material, for producing a vacuum arc plasma by generating vacuum arc discharge. The vacuum arc discharge is generated by utilizing a microwave plasma induced by the microwave introduced by the microwave introducing mechanism into the vacuum chamber as an arc generating means and an anode.

Magnetic field forming means may be disposed outside the vacuum chamber and adapted to effect application of a magnetic field capable of preventing the generated arc plasma from diffusion and confining it inside the vacuum chamber.

There may be further provided magnetic field generating means capable of generating an inverted magnetic field and expanding the plasma and supplying the expanded plasma to the substratal material retained in place by the holder.

The method of this invention for the formation of a film is characterized by disposing a metallic cathode destined to serve as a film forming material and a substratal material for film formation inside a vacuum chamber, furnishing the vacuum chamber with a prescribed gaseous atmosphere and, at the same time, introducing the microwave plasma into the vacuum chamber thereby giving rise to a microwave plasma, and subsequently enabling the microwave plasma as an anode to induce vacuum arc discharge and produce a vacuum arc plasma containing the ions of the metal mentioned above thereby allowing a film to be formed on the substratal material.

Nitrogen gas is introduced into the vacuum chamber for the formation of a nitride film and oxygen gas is introduced therein for the formation of an oxide film.

DETAILED DESCRIPTION OF PREFERRED EMBODIMENTS

Now, one embodiment of this invention will be described more specifically below with reference to the accompanying drawings.

Figure 1:
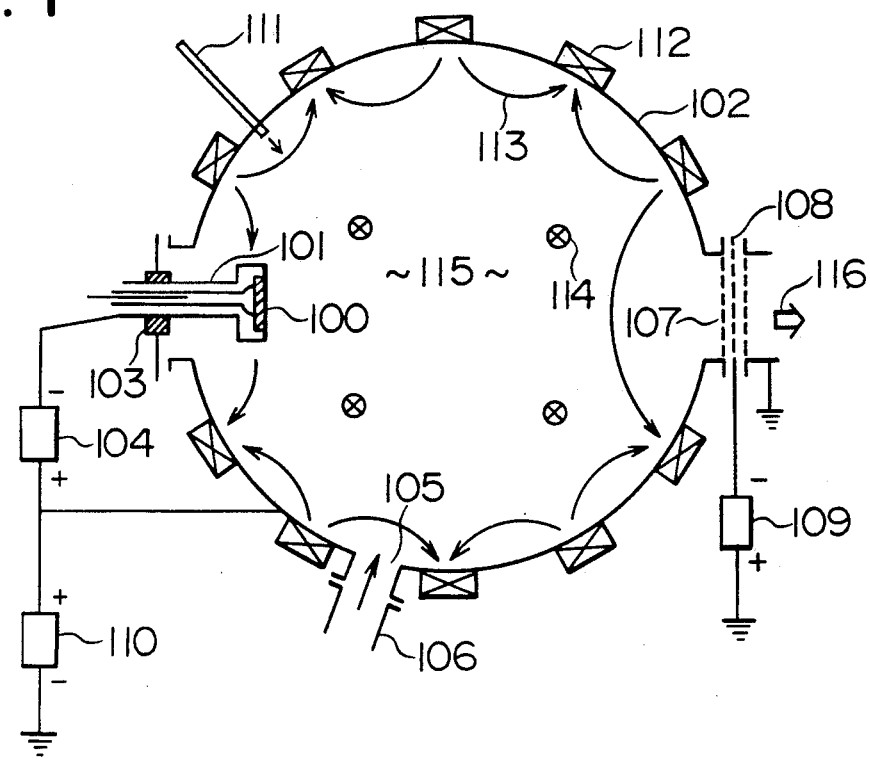
FIG. 1 is a cross section schematically illustrating an ion beam generating apparatus as one embodiment of this invention.

FIG. 1 is a diagram schematically illustrating an ion beam generating apparatus as one embodiment of this invention.

In this apparatus, a cathode 100 formed of a work blank of such a high melting metal as W, Ta, or Ti is attached to a cathode holder 101 provided on the interior thereof with a cooling water path and disposed inside a cylindrical vacuum chamber 102. The cathode holder 101 is fixed through the medium of an insulating member 103 to the vacuum chamber 102 and, at the same time, connected electrically to an arc power source 104.

The vacuum chamber 102 is provided with at least one microwave introducing part 105 which is opened into the vacuum chamber and adapted to introduce the microwave generated by a microwave power source (not shown) installed externally into the vacuum chamber 102 via a waveguide 106.

An ion extracting part 107 is opened into the vacuum chamber 102 at the position opposite to that of the cathode 100. In this ion extracting part 107, a set of ion extracting electrodes 108 are disposed. These ion extracting electrodes 108 are connected electrically to an ion extracting power source 109. An ion accelerating power source 110 accelerates the movement of ions generated inside the vacuum chamber 102 toward the central part. By 111 is denoted an inlet pipe for an inert gas.

Further, outside the vacuum chamber 102, a plurality of permanent magnets 112 are disposed in the axial direction so as to form a multicuspid magnetic field as indicated by a magnetic lines of force 113 relative to radial directions of the vacuum chamber 102. To form a Miller magnetic field indicated by magnetic lines of force 114 in the axial direction of the vacuum chamber 102, an air-core coil (not shown) is disposed outside the vacuum chamber 102. Owing to the combination of the two magnetic fields described above, a plasma containing space 115 is formed in the central part of the vacuum chamber 102.

This apparatus, similarly to the conventional apparatus, is allowed to have trigger electrodes disposed as arc generating means round the cathode 100. It is, however, enabled to effect generation of an arc by means of a microwave without requiring use of such trigger electrodes as described fully afterward.

Now, the method for forming an ion beam by the use of the apparatus of this embodiment will be described below.

First, a vacuum pump omitted from illustration is operated to vacuumize the vacuum chamber 102 and the interior of the vacuum chamber 102 is maintained at a degree of vacuum on the order of $10^{-2}$ to $10^{-4}$ Torr by introducing such an insert gas as Ar gas through the inlet pipe 111.

Then, a microwave plasma is generated by introducing a microwave of about 1 to 2 kW from the microwave inlet part 105. When the arc power source 104 is put to operation in the ensuant state of the apparatus, the microwave plasma triggers vacuum arc discharge between the cathode 100 and the microwave plasma as an anode to initiate the formation of a metal plasma of the cathode substance. At this time, when the introduction of the inert gas is stopped and the pressure of the atmosphere is consequently lowered, the microwave plasma ceases to exist and the vacuum arc discharge solely of the metal plasma continues to remain inside the vacuum chamber 102.

The introduced microwave, after the generation of the vacuum arc discharge, functions to heat the metal plasma and increase the polyelectrolytically dissociated ions in the plasma. In other words, by the application of the microwave, the energy of electrons in the plasma is amplified and, in consequence of this increase of energy, the collision between electrons and ions or between electrons and neutral particles renders easy the formation of polyelectrolytically dissociated ions and adds to the proportion of the polyelectrolytically dissociated ions in the metal plasma.

Then, the metal plasma formed as described above is contained inside the plasma containing space 115. An increase of the time of containment of the plasma promotes the polyelectrolytic dissociation of ions in the plasma and allows a further addition to the proportion of polyelectrolytically dissociated ions in the metal plasma.

From the metal plasma in which the introduction of the microwave and the application of a containing magnetic field have increased the proportion of polyelectrolytically dissociated ions, the ion extracting electrode 108 extracts only the ions and forms an ion beam 116 copiously containing polyelectrolytically dissociated ions.

In this invention, when the intensity of the magnetic field to be applied is set at a value such as to satisfy the conditions of electron cyclotron resonance (ECR) of the following formula relative to the microwave to be introduced, the initial formation of the microwave plasma and the subsequent heating of the metal plasma can be effected efficiently because the ECR has been made available therefor.

$$f[GHz] = 2.8B[G]$$

wherein f stands for the frequency of the microwave and B for the intensity of the magnetic field.

Figure 2:
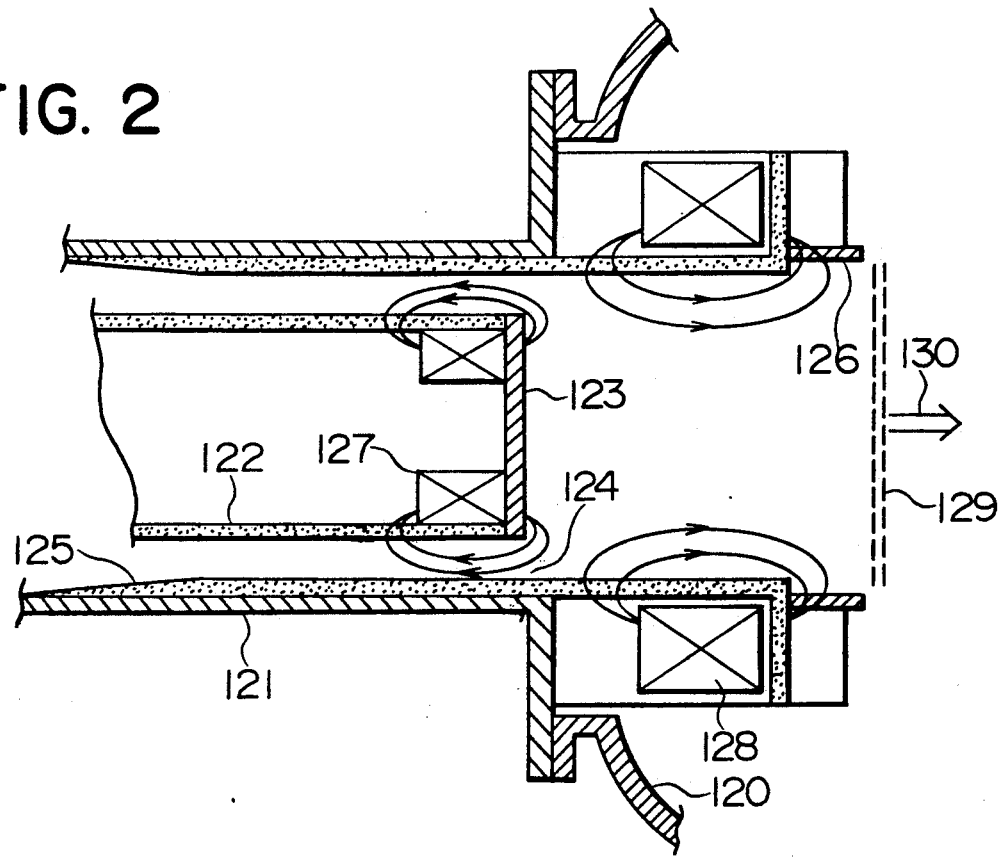
FIG. 2 is a partial cross section schematically illustrating an ion beam generating apparatus as another embodiment of this invention.

FIG. 2 is a diagram schematically illustrating the construction of the essential part of an ion beam generating apparatus as another embodiment of this invention.

This embodiment is a modification of the apparatus shown in FIG. 1 obtained by causing the cathode thereof to play the part of a microwave inlet part concurrently and decreasing the overall size of the apparatus.

In the apparatus of this embodiment, a coaxial waveguide for microwave is formed by using as an outer guide member a cylindrical part 121 projected from a vacuum chamber 120 and as an inner guide member jointly a cathode holder 122 disposed concentrically inside the outer guide member and a cathode 123 attached to the leading end thereof. The empty space between the two guide members forms a microwave inlet part 124. Denoted by 125 is an insulator. An anode 126 is disposed in front of the cathode 123 so as to be opposed thereto and is furnished with an opening part.

The microwave introduced through the microwave inlet part 124, similarly to that in the embodiment of FIG. 1, functions as arc generating means and, at the same time, plays the part of heating the metal plasma formed by the arc discharge and promoting the formation of polyelectrolytically dissociated ions in the plasma. In this apparatus, two annular permanent magnets 127, 128 of different outside diameters are disposed so as to be opposed to each other across the microwave inlet part 124. The magnetic field which is formed by these permanent magnets 127, 128 gives rise to a plasma containing space and prevents diffusion of the metal plasma and increases the time for the containment of the plasma.

In the apparatus of this embodiment, the formation of a microwave plasma is attained by vacuumizing the vacuum chamber 120, introducing an inert gas through a gas inlet pipe omitted from illustration thereby creating a prescribed degree of vacuum inside the vacuum chamber 120, and introducing therein a microwave through the microwave inlet part 124. When the arc power source is put to operation in the ensuant state of the apparatus, the microwave plasma triggers arc discharge between the cathode 123 and the anode 126 and induces formation of a metal plasma of the cathode substance. At this time, when the introduction of the inert gas is stopped and the pressure of the atmosphere is consequently lowered, the microwave plasma ceases to exist and the metal plasma alone continues to remain in the vacuum chamber.

The metal plasma is contained within the plasma containing space which is formed by the magnetic field of the permanent magnets 127, 128. Inside this space, the ions in the plasma undergo accelerated polyelectrolytic dissociation. Then, an ion extracting electrode 129 extracts the ions exclusively from the plasma and gives rise to an ion beam 130 copiously containing polyelectrolytically dissociated ions.

Figure 3:
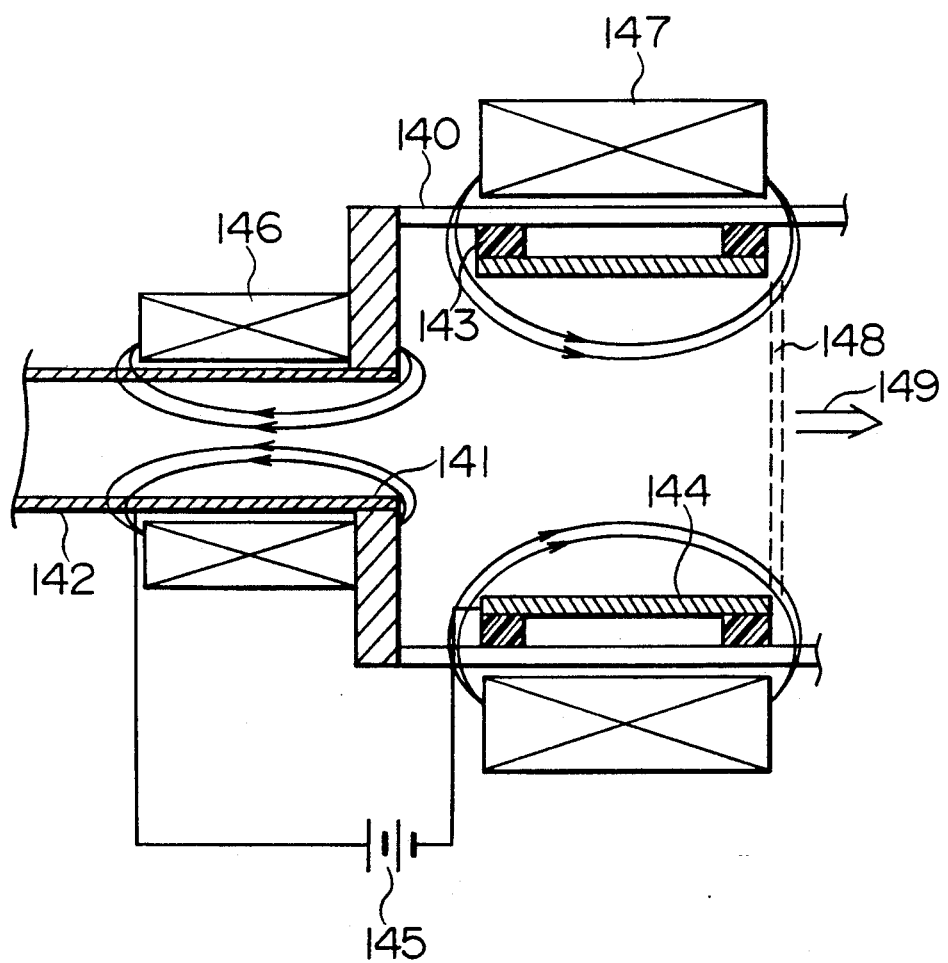
FIG. 3 is a partial cross section schematically illustrating an ion beam generating apparatus as still another embodiment of this invention.

FIG. 3 is a diagram schematically illustrating an apparatus as yet another embodiment of this invention.

In this apparatus, a cylindrical anode 141 has the leading end thereof opened into a vacuum chamber 140 and a waveguide 142 is disposed in series to the trailing end of this cylindrical anode 141. A cathode 144 is disposed through the medium of an insulating member 143 at the position perpendicular to the anode 141 inside the vacuum chamber 140. The anode 141 and the cathode 144 are electrically connected to an arc power source 145.

Two annular permanent magnets 146, 147 of different outside diameters are disposed outside the vacuum chamber 140. The magnetic field which is formed by these permanent magnets gives rise to an empty space for containing the plasma and prevents diffusion of metal plasma and increases the time for containing the plasma. An ion extracting electrode 148 is electrically connected to an ion extracting power source which is omitted from illustration.

The apparatus of this embodiment effects formation of a microwave plasma within the anode 141 by vacuumizing the vacuum chamber 140, introducing an inert gas through an inlet pipe omitted from illustration thereby creating a prescribed degree of vacuum inside the vacuum chamber 140, and introducing a microwave through the waveguide 142 into the anode 141. When the arc power source 145 is put to operation in the ensuant state of the apparatus, the microwave plasma triggers arc discharge between the anode 141 and the cathode 144 and induces formation of a metal plasma of the cathode substance. At this time, when the introduction of the inert gas is stopped and the pressure of the atmosphere is consequently lowered, the microwave plasma ceases to exist and the metal plasma alone continues to remain in the vacuum chamber.

The metal plasma is contained within the plasma containing space which is formed by the magnetic field of the permanent magnets 146, 147. Within the plasma containing space, the ions in the plasma undergo accelerated polyelectrolytic dissociation. Then the ion extracting electrode 148 extracts only the ions from the plasma and gives rise to an ion beam 149 copiously containing polyelectrolytically dissociated ions.

As described above, the ion beam generating apparatus in each embodiment described above enables formation of a metal ion beam containing polyelectrolytically dissociated ions in a large proportion and consequently realizes a cutdown on the capacity of the power source for the ion extracting system.

Now, a film-forming apparatus as one embodiment of this invention will be described below.

Figure 4:
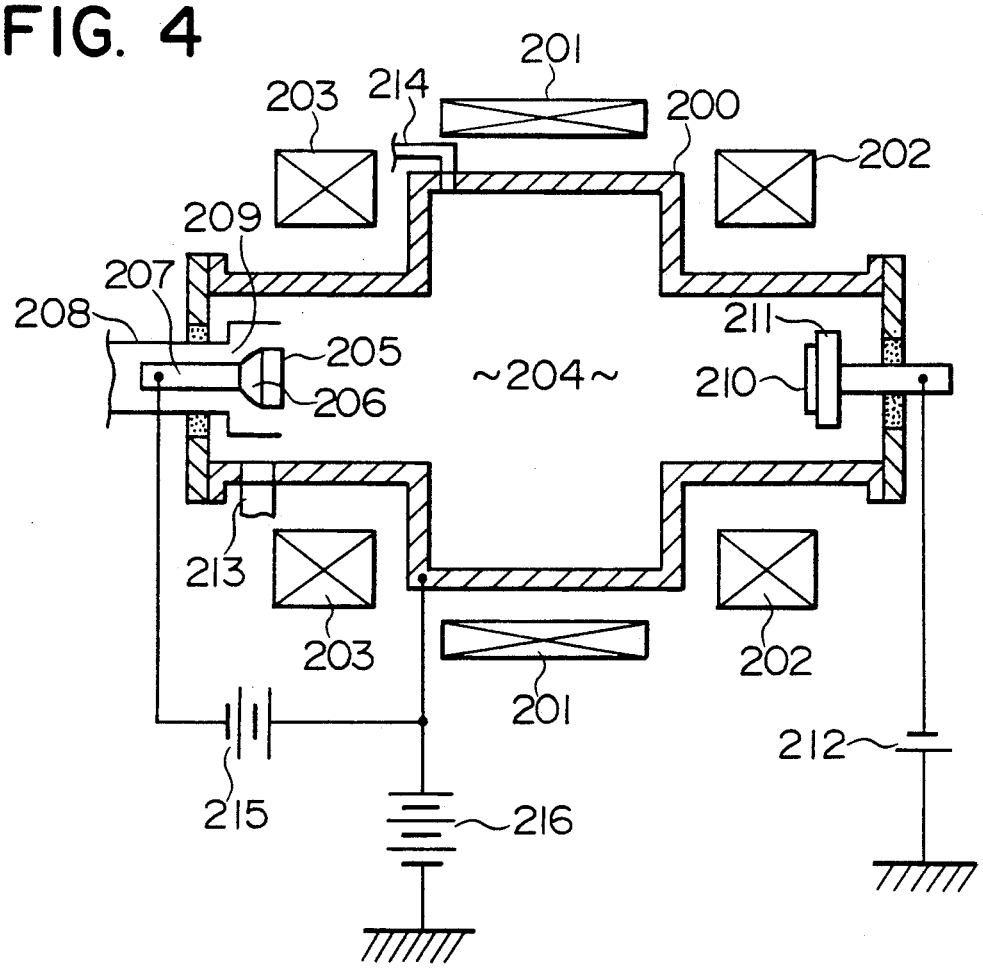
FIG. 4 is a cross section schematically illustrating a film-forming apparatus as one embodiment of this invention.

FIG. 4 is a diagram schematically illustrating the construction of the film-forming apparatus of this embodiment. The film-forming apparatus of this embodiment, similarly to the ion beam generating apparatus illustrated in FIG. 1, attains generation of vacuum arc discharge by using a microwave plasma as a trigger and further using this microwave plasma as an anode without requiring use of a trigger electrode or an anode electrode.

A vacuum chamber 200, similarly to the ion beam generating apparatus of FIG. 1, is formed in a virtually cylindrical shape. Round the periphery of this vacuum chamber 200, a plurality of permanent magnets 201 intended to give rise to such a multicusp magnetic field as indicated by the line of magnetic force 113 in FIG. 1 are disposed in the axial direction of the vacuum chamber 200. Core coils 202, 203 intended to form a Miller magnetic field are disposed outside the vacuum chamber 200 in such a manner as to be opposed to each other across the permanent magnets 201. By the combination of these two magnetic fields, a plasma containing space 204 is formed in the central part of the vacuum chamber 200.

In one of the terminal parts of the vacuum chamber 200, a cathode 205 is disposed in the central axial part of the vacuum chamber 200. This cathode 205 is fastened to a cylindrical inner guide member 207 through the medium of a cathode holder 206. The inner guide member 207 and a cylindrical outer guide member 208 encircling this inner guide member 207 jointly form a coaxial microwave guide. To be specific, the empty space between the inner guide member 207 and the outer guide member 208 constitutes a microwave inlet part 209.

In the other terminal part of the vacuum chamber 200, a holder 211 for supporting a substrate 210 for the formation of a film is disposed so as to be opposed to the cathode 205 mentioned above. To this holder 211 is connected a bias power source 212.

A vacuumizing pipe 213 connected to a vacuumizing device (omitted from illustration) is connected to the point of the vacuum chamber 200 near the cathode 205. To a point of the vacuum chamber 200 near the plasma containing space 204 is connected an inlet pipe 214 which is intended to introduce nitrogen gas or other similar inert gas into the vacuum chamber 200. In the diagram, 215 stands for an arc power source and 216 for an ion accelerating power source.

Now, the method for effecting the formation of a film on the substrate 210 by the use of the film-forming apparatus of this embodiment which is constructed as illustrated above will be described below.

First, a vacuum pump omitted from illustration is operated to vacuumize the vacuum chamber 200 and an inert gas such as Ar gas or $N_2$ gas is introduced through the inlet pipe 214 into the vacuum chamber 200 to create a degree of vacuum on the order of $10^{-2}$ to $10^{-4}$ Torr inside the vacuum chamber 200.

Then, the generation of a microwave plasma is induced by introducing a microwave of about 1 to 2 kW through the microwave inlet part 209. When the arc power source 215 is put to service in the ensuant state of the apparatus, the microwave plasma triggers vacuum arc discharge between the cathode 205 and the microwave plasma as an anode to initiate the formation of a metal plasma of the cathode substance.

At this time, when the introduction of the inert gas is stopped and the pressure of the atmosphere is consequently lowered, the microwave plasma ceases to exist and the metal plasma alone continues to remain in the vacuum chamber 200. For the purpose of forming a thin film of a simple metal, therefore, the introduction of such an inert gas as $N_2$ is stopped. For the purpose of forming a nitride film, an arc plasma containing nitrogen ions, for example, is formed by continuing the introduction of $N_2$ gas or changing the gas to be introduced from Ar gas to $N_2$ gas.

The plasma which is formed as described above is contained within the plasma containing space 204. After the generation of the vacuum arc discharge, the introduced microwave fulfills the role of heating the plasma and increasing polyelectrolytically dissociated ions in the plasma. The ions produced as described above in the plasma are directed to the substrate 210 applied by the bias voltage and allowed to form a thin metal film or a nitride film on the surface of the substrate 210.

In the formation of the nitride film mentioned above, the arc plasma containing nitrogen ions is formed by introducing $N_2$ gas. The formation of a thin film of oxide, carbide, etc. is attained by introducing $O_2$ gas, a hydrocarbon type gas such as methane or ethane, etc. in the place of the $N_2$ gas. A varying composite film composed of ions from the aforementioned gas plasma and a metal plasma can be formed by using a pertinent metal for the cathode.

Now, the results of the formation of a film attained by the use of the apparatus and method of this invention will be described below.

The formation of a film was carried out for 10 minutes on a substrate 210 of SUS 304 sheet having a polished surface and a wall thickness of 2 mm by using a cathode 205 made of titanium (Ti), introducing a microwave having a frequency of 2.45 GHz and an electric power of 300 W, and supplying $N_2$ gas at a flow volume of 8 sccm to the substrate. In this operation, the pressure in the vacuum chamber 200 was $4 \times 10^{-4}$ Torr and the voltage and amperage of the vacuum arc discharge were respectively 50 V and 50 A.

The thin film consequently formed had a thickness of 1.2 $\mu$m. By the SEM observation, this thin film was found to constitute itself a texture of high quality abounding in gloss, glittering in a golden color, and showing no sign of inclusion of molten particles. This thin film was analyzed by EPMA and RBS to find the composition ratio of Ti and N. The results were as shown below.

| | | |
|---|---|---|
| Ti | 76.54 (wt %) | 48.83 (at %) |
| N | 23.46 (wt %) | 51.17 (at %) |

It is clearly noted from these results that the composition ratio of Ti and N in the formed thin film was substantially 1:1.

As already mentioned above, the vacuum condition for the film formation in this case was $4 \times 10^{-4}$ Torr, a very low level as compared with the pressure prevalently used as in the sputtering method or the ion beam mixing method. The fact that the thin film of high quality having the Ti and N composition ratio of approximately 1:1 was obtained at such a low pressure as mentioned above may be ascribable to the conversion of both Ti and N into respective plasmas and further to the positive increase in the degree of electrolytic dissociation by means of the microwave.

Then, the formation of a film was carried out for 10 minutes by following the procedure just described, excepting Cu was used for the cathode 205 and Ar gas was used as an inert gas for the formation of a microwave plasma.

The thin film consequently formed had a wall thickness of 0.4 μm and constituted itself a texture of high quality abounding in gloss and emitting a copper color and showing no sign of inclusion of molten particles.

When the formation of a film was carried out by repeating the same procedure under continued application of the microwave and under discontinued application of the microwave with the supply of the Ar gas stopped and the generation of the metal plasma continued after the generation of the vacuum arc discharge in one test run, with the supply of the Ar gas continued even after the generation of the vacuum arc discharge in another test run, and with the two modes of operation combined in a further test run, the thin films consequently produced were identical in wall thickness and quality.

The formation of a film was carried out for 10 minutes by following the procedure mentioned above, excepting aluminum (Al) was used for the cathode 205 and quartz glass, silicon, and copper were used severally for the substrate 210.

In all the cases using quartz glass, silicon, and copper, there were obtained thin films of high quality abounding in gloss and emitting a white color and showing no sign of inclusion of molten particles.

In this case, a thin film of AlN was obtained by the addition of $N_2$ gas or a thin film of $Al_2O_3$ was obtained by the addition of $O_2$ gas instead.

Here, the formation of a thin film of AlN was carried out by using a mixed gas of Ar gas and $N_2$ gas, fixing the pressure in the vacuum chamber 200 at $1 \times 10^{-3}$ Torr, and setting the voltage and the amperage of the vacuum arc discharge respectively to 50 V and 60 A. The produced thin film was tested for electric resistance. The flow volumes of the $N_2$ gas and the magnitudes of electric resistance of the produced thin films were as shown below.

| | |
|---|---|
| Flow volume of $N_2$ gas = 0 | Resistance = 6.4 Ω |
| Flow volume of $N_2$ gas = 10 sccm | Resistance = 27 Ω |
| Flow volume of $N_2$ gas = 20 sccm | Resistance = 200 Ω |
| Flow volume of $N_2$ gas = 30 sccm | Immeasurable (Infinite) |
| Flow volume of $N_2$ gas = 40 sccm | Immeasurable (Infinite) |

It is clearly noted from the results indicated above that the magnitude of resistance of the produced thin film was varied by varying the flow volume of $N_2$ gas and the degree of insulation obtained in the produced thin AlN film was increased by increasing the amount of the $N_2$ gas to be supplied.

Then, the formation of a film was carried out for 10 minutes by following the procedure described above, excepting iron (Fe) was used in the place of Cu for the cathode 205. In this case again, there could be obtained a thin film of high quality abounding in gloss and emitting a white color and showing no sign of inclusion of molten particles. A thin film of $Fe_3N$ was obtained in this case by the addition of $N_2$ gas.

Now, this invention embodied in the formation of a thin film on a substrate of a large surface area will be described below.

Figure 5:
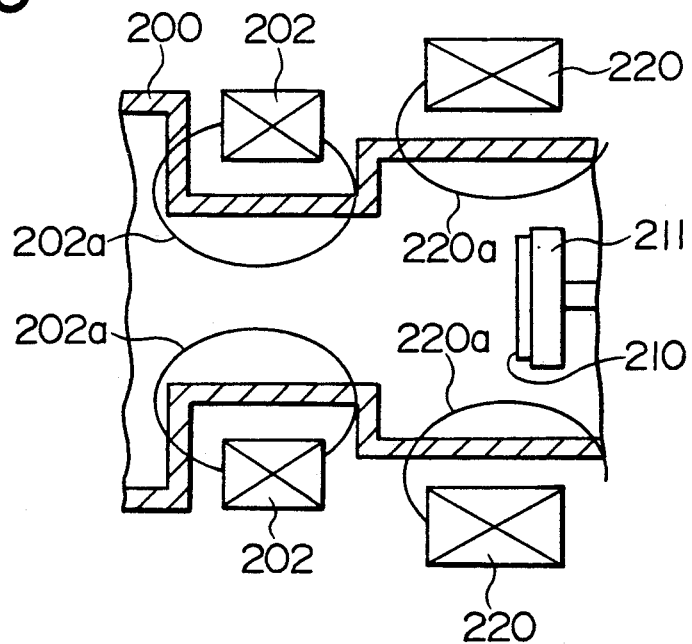
FIG. 5 is a partial cross section schematically illustrating a film-forming apparatus as another embodiment of this invention.
Figure 6:
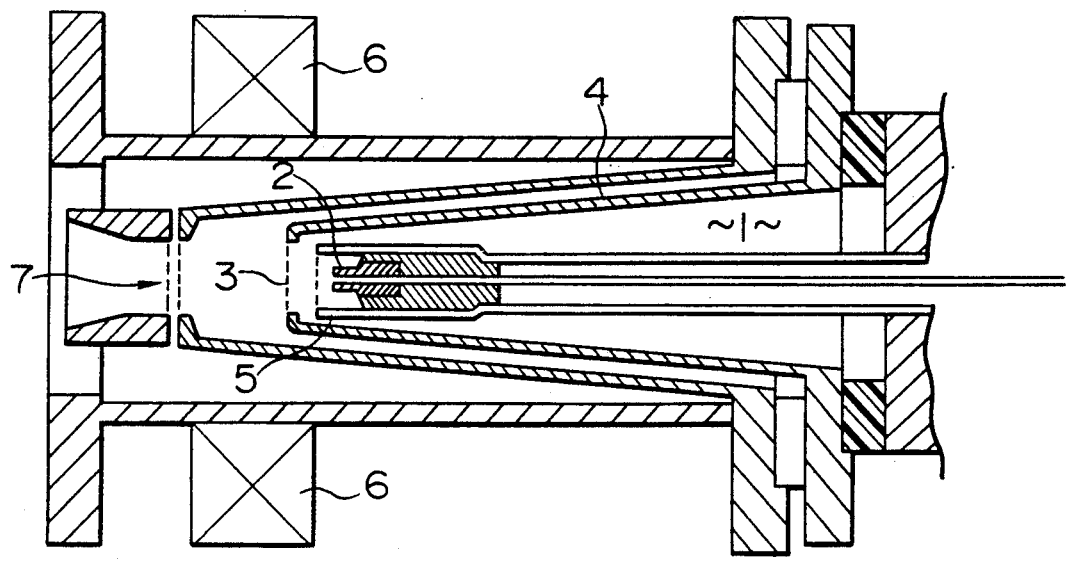
FIG. 6 is a partial cross section schematically illustrating a conventional ion beam generating apparatus.
Figure 7:
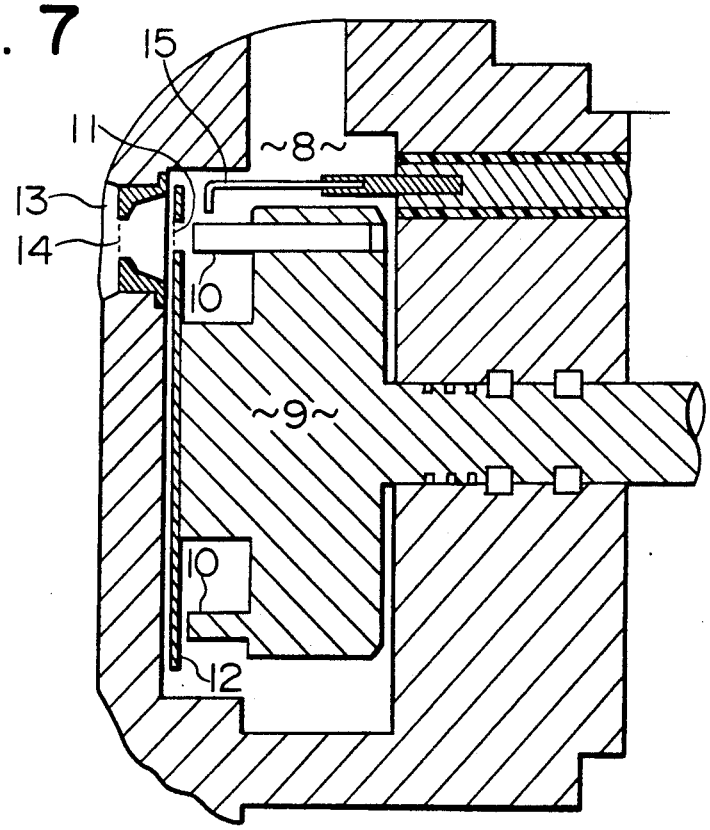
FIG. 7 is a partial cross section schematically illustrating another conventional ion beam generating apparatus.
Figure 8:
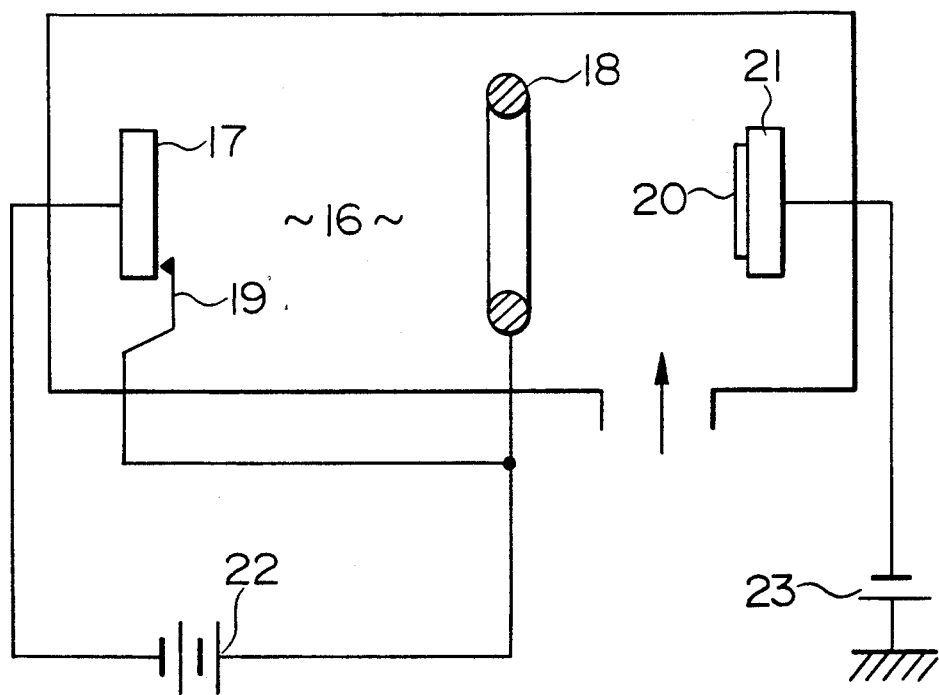
FIG. 8 is a cross section schematically illustrating a conventional film-forming apparatus.

When the formation of a film is carried out as in the embodiments cited above by causing a plasma prevented from expanding in the radial direction by the Miller magnetic field to act on a substrate, while the speed of film formation is improved, there arises the disadvantage that the apparatus used for the film formation is very large where the substrate has a large surface area. As illustrated in FIG. 5 which depicts the construction of the essential part, therefore, a core coil 220 adapted to form such an inverted magnetic field as indicated by a line of magnetic force 220a is provided on the lateral side of core coil 202 at the holder 211 side. The core coil 202 forms such an inverted magnetic field as indicated by a line of magnetic force 202a. The formation of a film on a substrate of a large surface area is enabled by the inverted magnetic field expanding the plasma and causing the expanded plasma to act on the substrate 210. Here, the construction of the other component parts of the apparatus and the method for the formation of a film are the same as those already described and, therefore, will be omitted from description.

The substrate 210 may be disposed inside the plasma containing space 204 to be formed in the central part of the vacuum chamber 200.

The ion beam generating apparatus of this invention enables formation of a metal ion beam containing polyelectrolytically dissociated ions in a large proportion as described above and consequently realizes a cutdown on the capacity of power source for the ion extracting system.

The film-forming apparatus of this invention is capable of forming a film of high quality suffering only sparingly from inclusion of impurities.

Further, the method of this invention for the formation of a film allows production of a film of high quality suffering only sparingly from inclusion of impurities.

What is claimed is:

1. An ion beam generating apparatus comprising:
   a vacuum chamber for retaining a vacuum therein, a microwave being introduced therein through at least one portion thereof,
   at least one vacuum arc plasma generating source having a cathode, an anode, and arc generating means using a microwave plasma produced by said microwave to imitate a vacuum arc plasma and disposed inside said vacuum chamber, and
   ion extracting means for extracting ions from the vacuum arc plasma.

2. An ion beam generating apparatus according to claim 1, wherein said anode is formed of the microwave plasma which is produced by introducing the microwave into an inert gas inside said vacuum chamber.

3. An ion beam generating apparatus according to claim 1, wherein said cathode concurrently serves as an inlet part for introducing said microwave into said vacuum chamber.

4. An ion beam generating apparatus according to claim 1, further comprising magnetic field generating means for applying a magnetic field to contain said plasma within a prescribed region inside said vacuum chamber.

5. A film-forming apparatus comprising;

a vacuum chamber for retaining a vacuum therein, a holder, disposed in the vacuum chamber, for holding a substrate intended for the formation of a film thereon, a microwave introducing mechanism for introducing a microwave into said vacuum chamber, and a vacuum arc plasma generating source, furnished with a cathode made of a film-forming material, for producing a vacuum arc plasma by using a microwave plasma produced by said microwave introduced into said vacuum chamber by said microwave introducing mechanism concurrently serving as arc generating means, and an anode for consequently inducing vacuum arc discharge.

6. A film-forming apparatus according to claim 5, further comprising magnetic field generating means for applying a magnetic field to contain said vacuum arc plasma within a prescribed region in said vacuum chamber.

7. A film-forming apparatus according to claim 5, further comprising magnetic field generating means for generating magnetic field thereby expanding said vacuum arc plasma and supplying the expanded plasma to said substrate retained in place by said holder.

8. A method for the formation of a film comprising the steps of;

disposing inside a vacuum chamber a cathode made of a metal destined to serve as a film-forming material and a substrate for allowing formation of the film thereon, creating a prescribed gaseous atmosphere inside said vacuum chamber and, at the same time, introducing a microwave into said vacuum chamber thereby inducing generation of a microwave plasma therein, and thereafter causing said microwave plasma to serve as an anode and induce vacuum arc discharge thereby giving rise to a vacuum arc plasma containing ions of said metal and forming the film on said substrate.

9. A method according to claim 8, wherein said gaseous atmosphere contains nitrogen gas and the formed film is a nitride film.

10. A method according to claim 8, wherein said gaseous atmosphere contains oxygen gas and the formed film is an oxide film.

* * * * *

UNITED STATES PATENT AND TRADEMARK OFFICE
CERTIFICATE OF CORRECTION

PATENT NO. : 5,168,197
DATED : December 1, 1992
INVENTOR(S) : MORITAKE TAMBA ET AL.

It is certified that error appears in the above-indentified patent and that said Letters Patent is hereby corrected as shown below:

Column 3, lines 10 and 30, change "film forming" to --film-forming--.

Column 10, line 63 (Claim 1), change "imitate" to --initiate--.

Signed and Sealed this

Fourth Day of January, 1994

Attest:

BRUCE LEHMAN

*Attesting Officer*     *Commissioner of Patents and Trademarks*